United States Patent
Tran et al.

[19]

[11] Patent Number: 6,018,267
[45] Date of Patent: Jan. 25, 2000

[54] HIGH OUTPUT SWING OPERATIONAL AMPLIFIER USING LOW VOLTAGE DEVICES

[75] Inventors: Hieu Van Tran, San Jose, Calif.; Anthony Dunne, Kells, Ireland

[73] Assignee: Information Storage Devices, Inc., San Jose, Calif.

[21] Appl. No.: 09/037,233

[22] Filed: Mar. 10, 1998

[51] Int. Cl.[7] ........................................................ H03F 3/45
[52] U.S. Cl. ......................... 330/253; 330/255; 330/261; 330/133
[58] Field of Search .................................... 330/253, 255, 330/261, 133

[56] References Cited

U.S. PATENT DOCUMENTS

| | | |
|---|---|---|
| 4,375,619 | 3/1983 | Saari . |
| 4,480,230 | 10/1984 | Brehmer et al. . |
| 4,570,128 | 2/1986 | Monticelli . |
| 4,714,895 | 12/1987 | Nicollini et al. . |
| 4,730,168 | 3/1988 | Senderowicz et al. . |
| 4,766,394 | 8/1988 | Yukawa . |
| 4,800,339 | 1/1989 | Tanimoto et al. . |
| 4,897,612 | 1/1990 | Carroll . |
| 4,963,834 | 10/1990 | Yukawa . |
| 4,987,381 | 1/1991 | Butler ...................................... 330/225 |
| 5,130,666 | 7/1992 | Nicollini . |
| 5,210,506 | 5/1993 | Koch et al. . |
| 5,212,455 | 5/1993 | Pernici et al. . |
| 5,212,456 | 5/1993 | Kovalcik et al. . |
| 5,289,058 | 2/1994 | Okamoto . |
| 5,307,315 | 4/1994 | Oowaki et al. . |
| 5,315,264 | 5/1994 | Sundby et al. . |
| 5,363,059 | 11/1994 | Thiel . |
| 5,374,859 | 12/1994 | Doyle et al. . |
| 5,388,084 | 2/1995 | Itoh et al. . |
| 5,412,309 | 5/1995 | Ueunten . |
| 5,434,538 | 7/1995 | Lee et al. . |
| 5,442,318 | 8/1995 | Badyal et al. . |
| 5,446,412 | 8/1995 | Kimyacioglu et al. . |
| 5,475,339 | 12/1995 | Maida . |
| 5,477,189 | 12/1995 | Koifman et al. . |
| 5,483,486 | 1/1996 | Javanifard et al. . |
| 5,497,122 | 3/1996 | Somayajula . |
| 5,499,209 | 3/1996 | Oowaki et al. . |
| 5,500,625 | 3/1996 | Rincon et al. . |
| 5,515,006 | 5/1996 | Chan . |
| 5,521,552 | 5/1996 | Butler . |
| 5,521,553 | 5/1996 | Butler . |
| 5,532,636 | 7/1996 | Mar et al. . |
| 5,550,510 | 8/1996 | Nagaraj . |
| 5,631,606 | 5/1997 | Tran . |

*Primary Examiner*—Michael B Shingleton
*Attorney, Agent, or Firm*—Blakely, Sokoloff, Taylor & Zafman LLP

[57] ABSTRACT

A power efficient high output swing operational ("HOOP") amplifier for integrated circuit analog signal processing is described. The operational amplifier includes a differential input stage and an output stage. The differential input stage is powered by a regular power supply while the output stage is powered by a voltage multiplier which results in a high voltage output swing without sinking significant power from the voltage multiplier. The high output voltage (e.g., 23 volts) is achieved using low voltage MOS devices. An output isolation technique is utilized to prevent possible latchup and contention. The operational amplifier also features a bias boot scheme to achieve a faster settling time from power up. In addition, the present invention provides realization of frequency compensation with highest possible breakdown and reduced noise coupling. A bias arrangement between input and output stages of the operational amplifier is used to further help reduce the power drawn from the voltage multiplier and decrease the settling time.

32 Claims, 3 Drawing Sheets

HIGH OUTPUT SWING OPERATIONAL AMPLIFIER USING LOW VOLTAGE DEVICES

BACKGROUND OF THE INVENTION

1. Field of the Invention

The present invention relates generally to the field of analog signal processing integrated circuits, and more specifically, to operational amplifiers.

2. Background Information

One of the basic building blocks for analog signal processing integrated circuits is the operational amplifier. It is used in various applications such as, for example, voltage buffering circuits, gain/attenuator circuits, switched capacitor circuits, voltage references, active filters, etc. The basic parameters and/or specifications to consider for operational amplifiers include the open loop gain, gain bandwidth product, output voltage swing, input common mode range, offset voltage, and power consumption. The most basic configuration of an operational amplifier is a two stage architecture, which is simple to stabilize and provides high gain. Namely, the two stage architecture consists of an input differential stage and an output stage. The input differential stage is used to provide an offset and common mode rejection while the output stage is used to provide a high gain.

At a low voltage power supply (e.g., 3 volts), the output voltage swing is severely limited. In the present invention, by using a voltage multiplier to supply only the output stage, the voltage multiplier is more power efficient and the output voltage swing is much higher than the available power supply voltage. This is extremely advantageous in applications where a high voltage swing is only needed at the output and not at the input such as, for example, in gain configurations and switched capacitor gain circuits. In addition, to operate at a high voltage (e.g., 20 volts), the conventional approach uses high voltage transistors (i.e., a high voltage process is needed). The present invention, however, utilizes only regular low voltage NMOS and PMOS devices as used in regular digital/analog low voltage circuits without such devices suffering from any breakdown problems. High voltage operation of an operational amplifier requires careful consideration of latchup conditions, noise couplings, and breakdown of devices. The present invention provides techniques to prevent such latchup conditions, noise couplings, and breakdown of devices.

In prior art U.S. Pat. No. 5,631,606 issued to Tran, the input stage and the intermediate stages have their power supplied from a voltage multiplier which allows the gates of the output MOS transistor to be much higher, resulting in a smaller size MOS transistor. But the output voltage itself is limited by the regular power supply. In the present invention, on the other hand, the output stage is powered by a high voltage multiplier which allows the output voltage to swing much higher than the voltage swing of the regular power supply. Moreover, in the '606 patent, the operational amplifier cannot operate at a high voltage (e.g., 20 V) because breakdown conditions of MOS transistors would be violated. In contrast, the operational amplifier of the present invention operates at a high voltage without violating any breakdown conditions.

SUMMARY OF THE INVENTION

In a preferred embodiment, the present invention provides a power efficient high output voltage swing operational amplifier which includes a differential input stage and an output stage. The differential input stage is powered by a regular power supply while the output stage is powered by a voltage multiplier which results in a much higher output voltage swing than the voltage swing of the regular power supply. Regular low voltage (e.g., 3 V) MOS transistors are used to provide the high voltage operation (e.g., 23 V). An output isolation technique is utilized to prevent possible latchup and contention. The operational amplifier features a current boot scheme to reduce the settling time. Also, frequency compensation is performed with the highest possible breakdown and reduced noise coupling. A bias arrangement between the input and output stages is provided to further help reduce the power drawn from the pump and speed up the settling time while still maintaining stability.

BRIEF DESCRIPTION OF THE DRAWINGS

The features and advantages of the present invention will become apparent from the following detailed description of the present invention in which.

DESCRIPTION OF THE PREFERRED EMBODIMENT

In the following description, for purposes of explanation, numerous details are set forth in order to provide a thorough understanding of the present invention. However, it will be apparent to one skilled in the art that these specific details are not required in order to practice the present invention.

Figure 1:
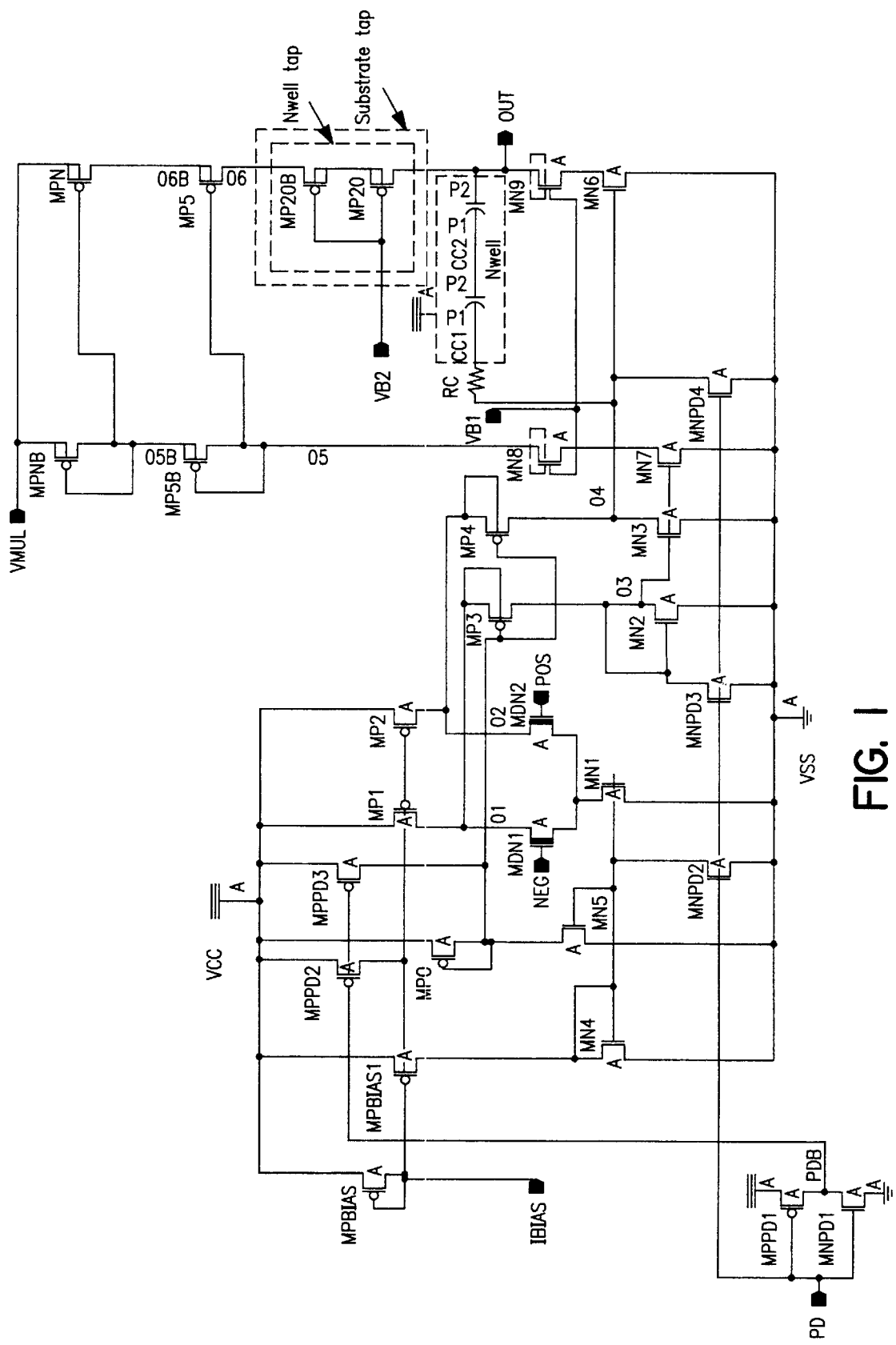
FIG. 1 illustrates a preferred embodiment of a folded cascode high voltage output swing operational amplifier.

FIG. 1 illustrates a preferred embodiment of a folded cascode high voltage output swing operational amplifier. The operational amplifier is a two stage amplifier that includes a folded cascode differential input stage and a push pull output stage. In particular, the operational amplifier includes four circuits, namely, a bias circuit, a folded cascode differential input circuit, an output circuit, and a power down circuit. The bias circuit consists of P-channel devices MPBIAS, MPBIAS1, and MP0 and N-channel devices MN4 and MN5. The folded cascode differential input circuit includes N-channel devices MDN1, MDN2, MN1, MN2, and MN3 and P-channel devices MP1, MP2, MP3, and MP4. The input differential pair (MDN1 and MDN2) are native NMOS devices (VT=~0 V) which allows the input voltage to swing close to both the negative rail voltage and the positive rail voltage. Typically, this can only be accomplished through the use of a complementary pair of PMOS and pair of NMOS in parallel. The bias circuit and the input circuit are powered from VCC. The output circuit includes N-channel devices MN6, MN7, MN8, and MN9, P-channel devices MP5, MP5B, MPN, MPNB, MP20, and MP20B, resistor RC, and capacitors CC1 and CC2. Resistor RC and capacitors CC1, and CC2 are used to provide stability compensation.

The power down circuit includes N-channel devices MNPD1–4 and P-channel devices MPPD1–3. When the circuit is disabled (power down mode), signal PD will be high (and PDB will be low) to turn ON device MNPD2 which turns OFF devices MN1, MN4, and MN5, and to turn ON devices MNPD3 and MNPD4 which pull Nodes O3 and O4 low, respectively. Also, with PDB low, devices MPPD2 and MPPD3 turn ON, which causes devices MP1 and MP2 and MP3 and MP4, respectively, to turn OFF. The operational amplifier circuit draws no current when in the power down mode. When the circuit is enabled, PD will be low (and PDB will be high) to turn OFF devices MNPD2–4 and MPPD2–3.

The output circuit is powered by a voltage multiplier VMUL which is at a much higher voltage than the power supply (VCC). The bias for the output stage is set at a very low current bias, i.e., at a minimum current to satisfy the output performance specification such as output slew rate, to minimize the power drawn from the pump. The setting of the bias for the output stage is performed through the proper sizing of MN7 and MN6 versus MN2 and MN3, respectively. On the other hand, the bias for the input stage is set at a high level since power is drawn from the normal power supply. This bias arrangement has the benefit of speeding up the settling time, i.e., increasing the bandwidth while still maintaining circuit stability through proper frequency compensation, while reducing the power drawn from VMUL.

To avoid various junction and gated diode breakdown problems associated with devices MN7 and MN6, MN8 and MN9 are provided to buffer the high voltage supplied by VMUL. Devices MN8 and MN9 have their gates connected to an intermediate voltage VB1 to increase the gated diode breakdown approximately linearly with the voltage level of VB1. Devices MN8 and MN9 further have their field implant pulled back from their drain junctions N+ to P– substrate to increase the junction breakdown. The pulling back of the field implant has the effect of reduced doping at the N+ to P– substrate junction, thereby resulting in tens of volts of higher breakdown voltage. The maximum voltage across the oxides of devices MN8 and MN9 is VMUL–VB1. Moreover, the maximum voltage that MN6 and MN7 see is VB1–VTN (VTN being the threshold voltage of device MN8 and MN9). Hence, the level of VB1 can be chosen to maximize the robustness of the breakdown condition. Of course, several intermediate voltage levels may also be used with additional NMOS transistors in series with devices MN8 and MN9.

To avoid junction and gated diode breakdown associated with MP5, MP20 is used to buffer the high voltage. MP20 has its gate connected to VB2. The maximum voltage that devices MP20 and MP20B see is (VMUL–VB2) or (VB2–0) depending on whether the output is at VMUL or zero. The maximum voltage that device MP5 sees is (V(O5)–(VB2+VTP)), where the voltage at Node O5 is approximately two PMOS threshold voltages below VMUL and VTP is the threshold voltage of device MP20B. Devices MP5, MP5B, MPN, and MPNB have their sources tied to their wells to minimize the voltage from the well to the drain to avoid violating the P+/N-well junction breakdown. A side benefit is that there is no body effect. VB2 may be chosen to satisfy various breakdown conditions associated with the PMOS devices.

The function of device MP20B in combination with device MP20 is to prevent a possible latchup condition during power down and a possible contention of the output voltage, OUT, with VMUL. Without device MP20B, if VMUL goes low while output OUT is at a high voltage, the diodes P+ to N-well formed by the drains of devices MP20, MP5, and MPN will be forward biased. The forward bias condition discharges the charge at the output Node OUT, which could be very large due to possible large capacitive loading. The discharged charge could possibly cause a latchup condition due to the parasitic bipolars of the CMOS structure. Moreover, this condition can also cause the output OUT to be shorted to VMUL through the above-mentioned parasitic diodes. The addition of device MP20B serves to isolate the output OUT from the drain of MP5. When the drain of MP5 is discharged to VMUL, through the diodes of MP5 and MPN, MP20B is cut-off since its gate is at VB2 (e.g. 10 V) and its drain is tied to its well. As shown in FIG. 1, devices MP20 and MP20B should have their guard rings surrounding completely. Devices MP5, MP5B, MPN, and MPNB should also have their complete guard rings to avoid possible latchup.

Frequency compensation is provided through resistor RC and capacitors CC1 and CC2. Connection and layout of the poly2 to poly1 capacitors CC1 and CC2 are performed to achieve the highest breakdown and to reduce the noise coupling. Capacitor CC1 is in series with CC2 to divide the voltage across the poly2-poly1 by half to avoid the poly2-poly1 breakdown. Since poly2 is on top of poly1 and poly1 is on top of the field oxide, poly2 should have the highest possible field threshold voltage and the least capacitive coupling to the substrate. Therefore, CC2 has the poly2 plate connected to the output node. Furthermore, to minimize the capacitive coupling from the substrate, a dummy N-well is placed underneath CC1 and CC2 and connected to the power supply which isolates the substrate coupling.

Voltage breakdowns for a typical CMOS process are shown in Table 1.

TABLE 1

| NMOS | PMOS |
| --- | --- |
| BVJN+/P-sub = 16V | BVJP+/N-well = 15V |
| BVDSSN = 15V | BVDSSP = 15V |
| BVGOXN = 16V | BVGOkP = 16V |
| BVJN+/P-sub w/o FI = 35V | |

BVJP+/N-well is the junction voltage breakdown of P+/N-well. BVJN+/P-sub is the junction voltage breakdown of N+/P– substrate. BVJN+/P-sub w/o FI is the junction voltage breakdown of N+/P– substrate with field implant pulled back from N+. The reason that the junction breakdown of N+/P– substrate with field implant pulled back is higher than that of the normal N+/P– substrate is that the effective substrate doping in the former is much less. BVDSSP is the gated diode voltage breakdown of a PMOS, BVDSSN is the gated diode voltage breakdown of a NMOS, BVGOXP is the voltage breakdown of a PMOS gate oxide, and BVGOXN is the voltage breakdown of a NMOS gate oxide.

The p/n junction voltage breakdown is the voltage at which significant current begins to flow normally due to the avalanche multiplication of the energetic ionizing carriers, which is caused by a high field across the p/n junction. The gated diode breakdown is the voltage at which significant current begins to flow due to a non-destructive Zener junction diode breakdown, where current flows from the drain to the substrate with the gate grounded and the source floating. The junction or gated diode breakdown are inherently non-destructive. However, the avalanche current must be limited by some means to avoid excessive power dissipation which could cause permanent damage to the device. The junction or the gated diode breakdown causes the voltage source, such as from a voltage multiplier, to clamp at the breakdown voltage. The oxide breakdown is the voltage at which destructive breakdown of the oxide begins to occur due to a high field across the oxide. The voltage across the gate oxide must be designed smaller than the oxide voltage breakdown to avoid such oxide destruction.

Circuit Operation

The folded cascode differential input circuit is biased by way of a bias generator (not shown) which provides a bias current IBIAS to the gate and drain of diode connected device MPBIAS. The bias current IBIAS is mirrored to devices MPBIAS1, MP1 and MP2. In turn, the current through device MPBIAS1 flows through device MN4 and is mirrored thereby to device MN1. Device MN1 is a controllable current source (controlled by the bias current) for the differential input stage. The current through MN1 is equal to the sum of the currents through devices MDN1 and MDN2, and remains constant (assuming the bias current Fit remains constant) with voltage variations across the POS and NEG input terminals. The current through device MN4 is also mirrored to device MN5 to provide the current through diode-connected device MPO. Device MPO is sized such that when it is conducting, the gate voltage of devices MP3 and MP4 are substantially equal to one P-channel threshold voltage plus a saturation voltage for devices MP1 and MP2 below VCC.

The sum of the currents through the differential input devices MDN1 and MDN2, which is equal to the current through device MN1, is equal to the sum of the currents through devices MP1 and MP2 minus the sum of currents passing through devices MP3 and MP4.

Assuming perfect transistors, if the differential input across the POS and NEG terminals is zero, the currents through devices MDN1 and MDN2 will be equal. Since the currents through devices MP1 and MP2 are equal, the currents through devices MP3 and MP4 must be equal. The current through device MP3 is mirrored by device MN2 to device MN3, so that the currents in devices MP4 and MN3 are equal. Therefore, Node 04 neither charges nor discharges, but remains at whatever voltage is on the node.

The output circuit includes a first leg consisting of devices MN7, MN8, MP5B, and MPNB and a second leg consisting of devices MN6, MN9, MP20, MP20B, MP5, and MPN. The current through device MN2 is also mirrored to device MN7 and sets the current through the first leg of devices MPNB, MP5B, MN8, and MN7. The current through the first leg of devices is in turn mirrored by diode-connected devices MPNB and MP5B to devices MPN and MP5, respectively, such that the current through devices MPN, MP5, MP20B, and MP20 to the output OUT is substantially the same as the current through the first leg of devices. The series current mirrors MPNB-MPN and MP5B-MP5 provide a more accurate current mirror, i.e., the current flowing through the second leg of devices more accurately mirrors the current flowing through the first leg of devices than if only a single current mirror is used.

Continuing to refer to FIG. 1, if a positive differential voltage is applied across the POS and NEG terminals, the higher voltage at the POS terminal causes a higher proportional current to flow through MDN2 and a lower proportional current to flow through MDN1. With a higher proportional current through MDN2 and a lower proportional current through MDN1, the current flowing through MP3 and into Node O3 is greater than the current flowing through MP4 and into Node O4. The increased current through MP3 is mirrored by diode-connected device MN2 to devices MN3 and MN7. Now device MN3 sinks more current than device MP4 sources. Consequently, device MN3 pulls the voltage of Node O4 down. As the voltage of Node O4 falls, device MN6 starts to turn OFF proportionately, which causes current mirrored by device MN7 to devices MPN, MP5, MP20B, and MP20 to cause the output OUT to rise. Therefore, the output OUT responds positively with a higher voltage at the POS terminal.

Conversely, if a negative differential voltage is applied across the POS and NEG terminals, the higher voltage at the NEG terminal causes a higher proportional current to flow through MDN1 and a lower proportional current to flow through MDN2. With a higher proportional current through MDN1 and a lower proportional current through MDN2, the current flowing through MP4 is greater than the current flowing through MP3. With the current through MP3 mirrored by device MN2 to device MN3, device MP4 sources more current than device MN3 sinks. As such, the current sourced by devices MP4 minus the current sinked by device MN3 flows into the gate of device MN6 to charge up the same and cause the voltage of Node O4 to rise. As the voltage of Node O4 rises, device MN6 starts to turn ON, which causes the output voltage OUT to fall.

Assuming VMUL is 23 V and VB1 and VB2 are each 10 V, the maximum voltage the output OUT will reach is VMUL. The voltage across the gate oxide of devices MP20 and MP20B is 23 V–10 V or 13 V. The voltage at O5 is approximately 23 V–2 VTP (VTP is the threshold voltage of MPNB and MP5B)–Δ V (Δ V being the voltage drop across MPNB and MP5B when in saturation), which is approximately 19 V. The voltage across the gate oxide of device MN8 is 19 V–10 V or 9 V. The voltage across the gate oxide of device MN9 is 23 V–10 V or 13 V. Moreover, the voltage drop across the gate oxide of each device MN7 and MN6 is approximately 10 V–VTN (VTN being the threshold voltage of each device MN8 and MN9), or 9 V. The voltage drop across each capacitor CC1 and CC2 is 23 V/2 or 11.5 V. As can be seen from Table 1, at extreme voltages, none of the devices violate the breakdown conditions.

The minimum output voltage is zero volts. VB2 will clamp the source of MP20B at VB2+VTP, or 11 V. The voltage drop across the gate oxide of device MP20 is VB2–0 or 10 V. The voltage drop across the gate oxide of device MP5 is V(O5)–11 V or 8 V. The voltage drop across each device MN8 and MN7 is the same as before. The voltage drop across the gate oxide of device MN9 is VB1 or 10 V. Again no breakdown conditions are violated. Note that MP20 and MP20B enter the linear region at the high output voltage and MN9 enters the linear region at the low output voltage. This behavior is distinct from the conventional analog design practice of cascading which always maintains devices MP20, MP20B, and MN9 in saturation under all conditions.

One particular application of the present invention is in a mixed mode integrated circuit system having non-volatile memory on-chip where the operational amplifier is used to regulate high voltages (e.g., 10 to 20 volts), as required for analog non-volatile memory programming. An example of a mixed mode integrated circuit is described in co-pending U.S. patent application, Ser. No. 08/819,665 entitled "Analog Signal Recording and Playback Integrated Circuit and Message Management System" by Tran et al., and assigned to the assignee of the present invention.

Figure 2:
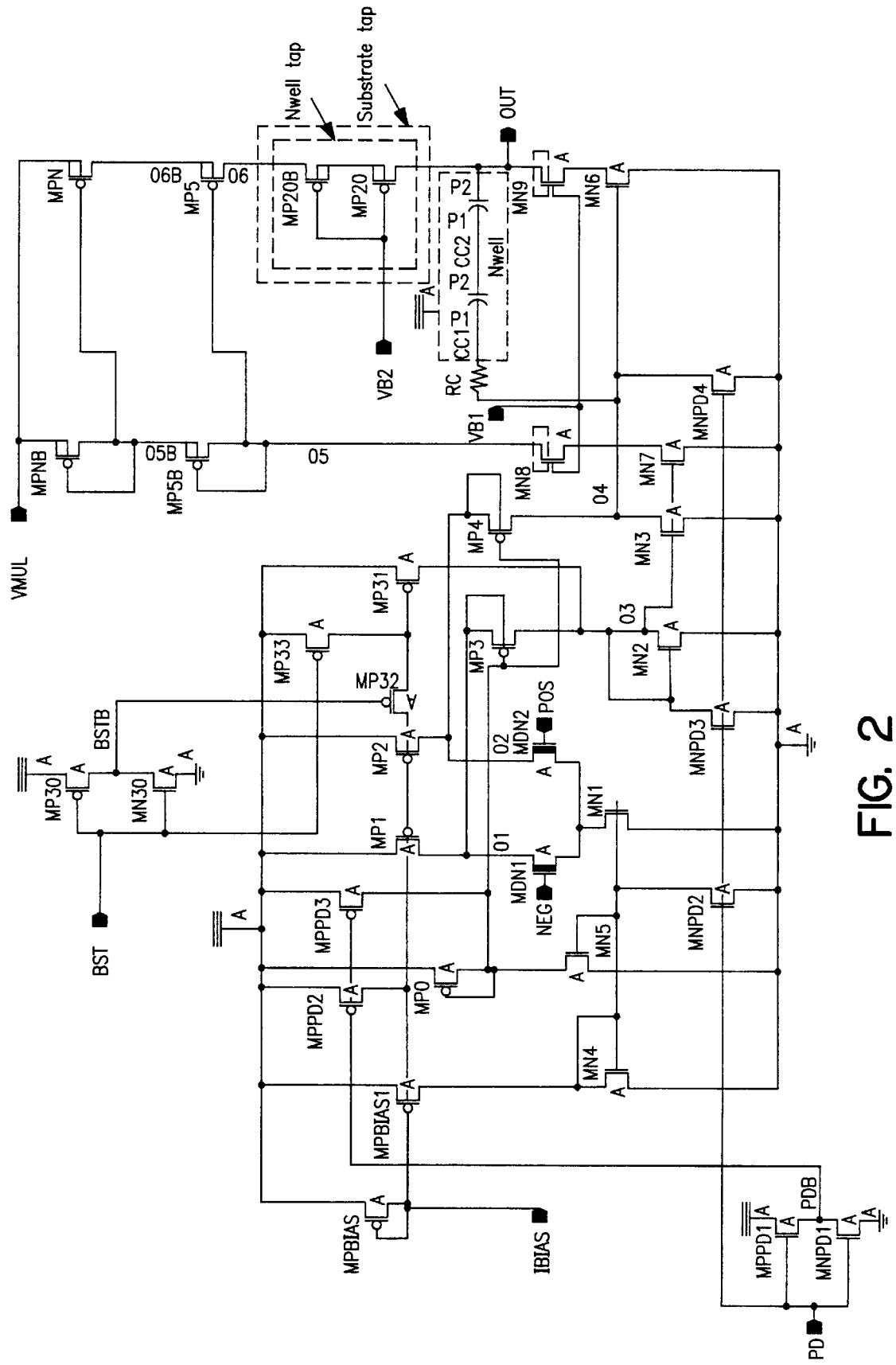
FIG. 2 illustrates another preferred embodiment of the folded cascode high voltage output swing operational amplifier.

FIG. 2 illustrates another preferred embodiment of the folded cascode high voltage output swing operational amplifier. The operational amplifier circuit of FIG. 2 is the same as that in FIG. 1 except that the operational amplifier circuit of FIG. 2 further includes a current boot circuit. To maximize power efficiency, the output stage is biased at a very low current. This implies that the output voltage ramp up time is very slow in the beginning. The added current boot circuit decreases the ramp up time of the output voltage.

In particular, the current boot circuit includes N-channel device MN30 and P-channel devices MP30–33. When BST is low (and BSTB is high), MP32 turns OFF and MP33 turns ON to turn OFF MP31. In this configuration, the circuit behaves exactly the same as before. Conversely, when BST is high (and BSTB is low), MP33 turns OFF and MP32 turns ON to connect the gate of device MP31 to the bias current IBIAS mirroring device MPBIAS, now device MP31 acts as a current source into Node O3 so that the bias current IBIAS is mirrored to device MP31 and increases the current flowing into Node O3 and device MN2 by approximately two-hundred percent. This increased current in device MN2 is mirrored to device MN3 which turns ON harder to further pull Node O4 down and turn OFF device MN6. Moreover, the increased current is also mirrored by device MN7 through the first leg of devices which is in turn mirrored by devices MPNB and MP5B to devices MP5 and MPN (to cause the same to turn ON harder) through the second leg of devices. Consequently, the output OUT rises much faster, thereby resulting in a faster settling time from power up.

The BST signal is a typical one shot timing generated signal from PD. As the circuit is enabled (i.e., PD goes from high to low), BST goes high for a predetermined time ($t_d$) to enable the current boot circuit and increase the ramp up time. After the predetermined time ($t_d$) has passed, BST goes low to disable the current boot circuit. It is apparent to one skilled in the art that the one shot timing signal BST may also be generated from, for example, the signal that enables VMUL to the operational amplifier circuit.

Figure 3:
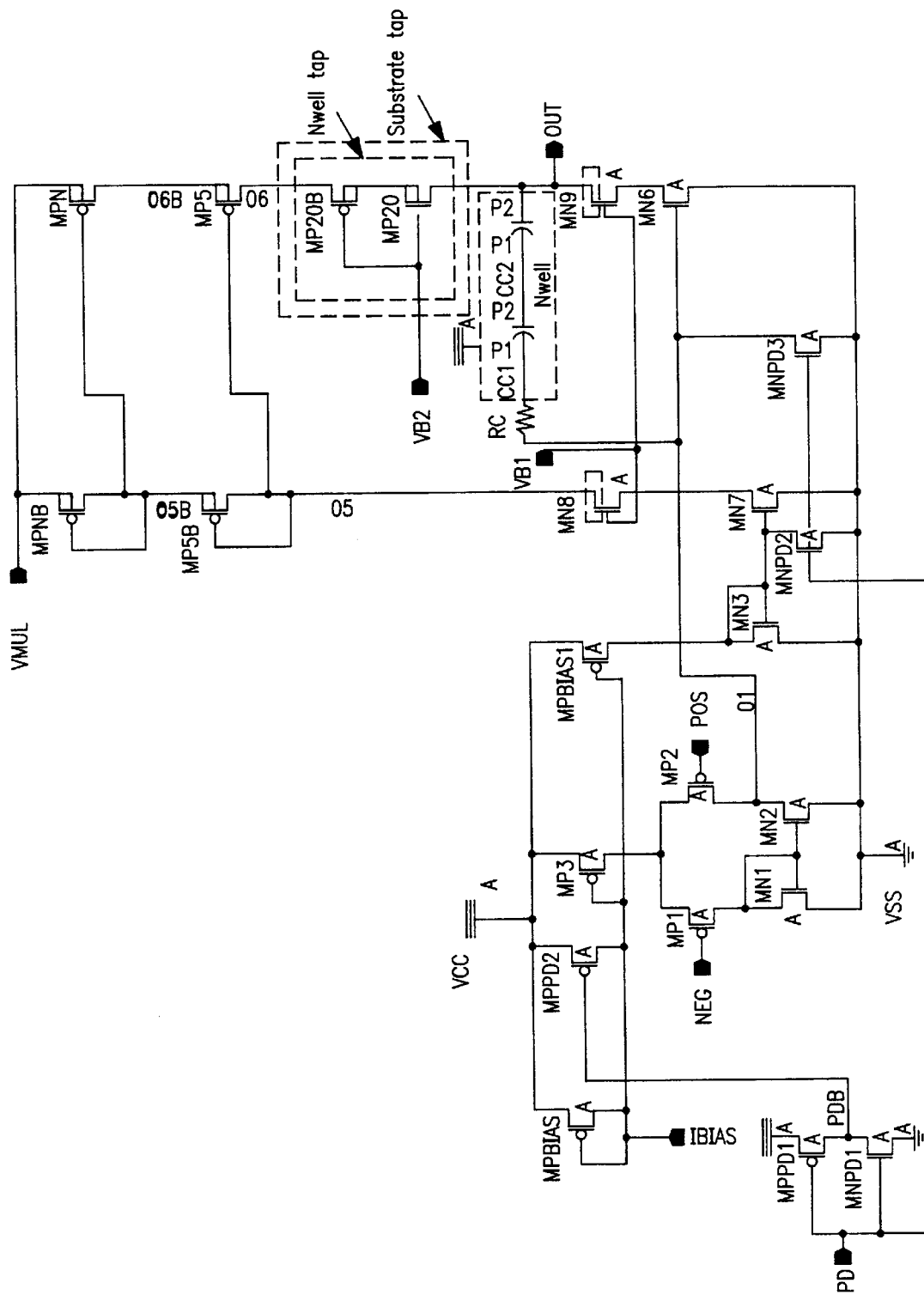
FIG. 3 illustrates another embodiment of a two stage high voltage output swing operational amplifier.

FIG. 3 illustrates another embodiment of a two stage high voltage output swing operational amplifier. As with the embodiments shown in FIG. 1 and 2, the operational amplifier of FIG. 3 is biased at a much lower current in the output stage and at a higher current in the input stage. This helps minimize the power drawn from the pump (VMUL) while still maintaining circuit stability and settling time.

Referring to FIG. 3, the differential input stage consists of a PMOS input differential pair MP1 and MP2, a NMOS current mirror load MN1 and MN2, and a PMOS tail current device MP3. Device MPBIAS is used to bias the tail current device MP3. The sources of device MP3 and MPBIAS are connected to the regular power supply VCC. The output stage is similar to that of FIGS. 1 and 2 except that the pull-up for the output stage is a fixed current bias mirrored from MPBIAS through devices MPBIAS1 and MN3 to device MN7.

More specifically, a bias current IBIAS is provided to the gate and drain of diode-connected device MPBIAS. The bias current IBIAS is mirrored to device MP3 to provide a tail current for the differential input stage. Thus, the tail current is controlled by the bias current IBIAS. The current flowing through device MP3 is equal to the sum of the currents through devices MP1 and MP2 and remains constant (assuming the bias current remains constant) with voltage variations across the POS and NEG terminals. If devices MP1 and MP2 are the same size and devices MN1 and MN2 are the same size and the differential input across the POS and NEG terminals is zero, the currents through devices MP1 and MP2 will be equal. The current through device MP1 is mirrored by diode-connected device MN1 to device MN2, so that the currents through devices MP2 and MN2 are equal. Consequently, Node O1 neither charges nor discharges, but remains at whatever voltage is on the node.

The bias current is also mirrored to device MPBIAS1 which forms the current through diode-connected device MN3. The current through device MN3 is in turn mirrored to device MN7 to form a fixed current (controlled by the bias current IBIAS) through the first leg of devices MPNB, MP5B, MN8, and MN7. This fixed current is also mirrored by devices MPNB and MP5B to devices MPN and MP5, respectively, to form the current through devices MPN, MP5, MP20B, and MP20 to the output OUT.

In circuit operation, a differential input voltage across the POS and NEG terminals causes a differential current to flow through Node O1. The voltage at Node O1 causes the gate-to-source voltage of device MN6 to change, which causes the output OUT to change in an opposite direction. In particular, if the voltage at the POS terminal is higher than the voltage at the NEG terminal, a higher proportional current flows through device MP1 and a lower proportional current flows through device MP2. The current through device MP1 is mirrored by diode-connected device MN1 to device MN2. Since device MN2 sinks more current than device MP2 sources, the voltage of Node O1 is pulled low. As the voltage of Node O1 approaches zero, device MN6 turns OFF. Consequently, the output OUT rises.

On the other hand, if the voltage at the NEG terminal is higher than the voltage at the POS terminal, a higher proportional current flows through device MP2 and a lower proportional current flows through device MP1. The current through device MP1 is mirrored to device MN2 by device MN1. Since device MP2 sources more current than device MN2 sinks, a residual current, which is equal to the difference between the current sourced by device MP2 and the current sinked by device MN2, flows into the gate of device MN6 to charge up the voltage of Node O1. As the voltage of Node O1 charges up, device MN6 turns ON harder and causes the output OUT to fall.

The minimum output is limited by the voltage drop across device MN6 due to the bias current flowing through it, which could be tens of millivolts if the bias current is small or the size of device MN6 is sufficiently large. The maximum output voltage is limited by VMUL which may be any value (e.g., 23 volts) as long as it does not violate any breakdown mechanisms. As such, a very high output swing is achieved. The voltage drop across various devices is similar to those as described with respect to FIG. 1, and hence no breakdown conditions are violated. It is contemplated that other PMOS and NMOS transistors with other intermediate voltage levels may be added in series with MP20, MN8 and MN9 to decrease the voltage breakdown requirement even further. Intermediate voltages VB1 and VB2 may be adjusted to give optimal voltage condition. In the preferred embodiment, VMUL is 23 volts and VB1 and VB2 are each 10 volts. From the description, it is apparent to one skilled in the art that the embodiments described in FIGS. 1–3 are readily applicable to other operational amplifier architectures such as, but not limited or restricted to, telescopic or three stage operational amplifiers.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A high output voltage swing operational amplifier, comprising:

first and second power supply terminals having first and second voltages thereon, respectively, wherein the second voltage is greater than the first voltage;

a differential input stage coupled between the first power supply terminal and a common terminal;

an output stage coupled between the second power supply terminal and the common terminal, and to the differential input stage, said output stage including first and second legs of devices, said first leg of devices including a first device having a gate coupled to the input stage, a drain, and a source coupled to the common terminal, a second device having a gate coupled to a first terminal having a first intermediate voltage thereon, a drain coupled to an output terminal, and a source coupled to the drain of the second device, and a third device having a gate coupled to a second terminal having a second intermediate voltage thereon, a drain coupled to the output terminal, and a source coupled to the second power supply terminal; said second leg of devices including a fourth device having a gate coupled to the input stage, a drain, and a source coupled to the common terminal, and a fifth device having a gate coupled to the first terminal, a drain coupled to the second power supply terminal, and a source coupled to the drain of the fourth device.

2. The high output voltage swing operational amplifier of claim 1 wherein the differential input stage comprises:

sixth and seventh devices each having a gate coupled to one of respective first and second input terminals, a drain, and a source;

eighth and ninth devices each having a gate coupled together and to a bias circuit, a drain coupled to one of respective drains of the sixth and seventh devices, and a source coupled to the first power supply terminal;

a current source coupled between the sources of the sixth and seventh devices and the common terminal, and controlled by the bias circuit;

tenth and eleventh devices each having a gate coupled to the bias circuit, a drain, and a source coupled to one of the respective drains of the sixth and seventh devices, respectively;

a twelfth device having a gate, a drain coupled to its gate and the drain of the tenth device, and a source coupled to the common terminal; and a thirteenth device having a gate coupled to the gates of the fourth device and the twelfth device a drain coupled to the drain of the eleventh device and the gate of the first device, and a source coupled to the common terminal.

3. The high output voltage swing operational amplifier of claim 2 wherein the first, second, fourth through seventh, twelfth, and thirteenth devices are devices of a first conductivity type, and the third and eighth through eleventh devices are devices of a second conductivity type.

4. The high output voltage swing operational amplifier of claim 2 wherein the first, second, fourth through seventh, twelfth, and thirteenth devices are N-channel metal oxide semiconductor devices, and the third and eighth through eleventh devices are P-channel metal oxide semiconductor devices.

5. The high output voltage swing operational amplifier of claim 2 wherein the bias circuit comprises:

a fourteenth device having a gate coupled to a bias current terminal, a drain coupled to its gate, and a source coupled to the first power supply terminal;

a fifteenth device having a gate coupled to the gates of the eighth, ninth, and fourteenth devices, a drain, and a source coupled to the first power supply terminal;

a sixteenth device having a gate coupled to the current source, a drain coupled to its gate and the drain of the fifteenth device, and a source coupled to the common terminal;

a seventeenth device having a gate coupled to the gate of the sixteenth device, a drain, and a source coupled to the common terminal; and an eighteenth device having a gate coupled to the gates of the tenth and eleventh devices, and the drain of the seventeenth device, a drain coupled to its gate, and a source coupled to the first power supply terminal.

6. The high output voltage swing operational amplifier of claim 2 further comprising a current boot circuit coupled to the differential input stage for decreasing a ramp up time of an output voltage on the output terminal during bootup.

7. The high output voltage swing operational amplifier of claim 6 wherein the current boot circuit comprises:

a third terminal having a boot voltage thereon and a fourth terminal having a complement of the boot voltage thereon;

a fourteenth device having a gate coupled to the boot terminal, a drain, and a source coupled to the first power supply terminal;

a fifteenth device having a gate coupled to the drain of the fourteenth device, a drain coupled to the drain of the twelfth device, and a source coupled to the first power supply terminal; and a sixteenth device having a gate coupled to fourth terminal, a drain coupled to the gate of the fifteenth device, and a source coupled to the gates of the eighth and ninth devices.

8. The high output voltage swing operational amplifier of claim 1 wherein each of the first through fifth devices is a low voltage MOS device.

9. The high output voltage swing operational amplifier of claim 2 wherein the differential input stage comprises:

sixth and seventh devices each having a gate coupled to one of respective first and second input terminals, a drain, and a source;

an eighth device having a gate, a drain coupled to its gate and the drain of the sixth device, and a source coupled to the common terminal;

a ninth device having a gate coupled to the gate of the eighth device, a drain coupled to the drain of the seventh device and the gate of the first device, and a source coupled to the common terminal;

a tenth device having a gate coupled to a bias circuit, a drain coupled to the sources of the sixth and seventh devices, and a source coupled to the first power supply terminal;

an eleventh device having a gate coupled the bias circuit, a drain, and a source coupled to the first power supply terminal; and a twelfth device having a gate coupled to the gate of the fourth device, a drain coupled to its gate and the drain of the eleventh device, and a source coupled to the common terminal.

10. The high output voltage swing operational amplifier of claim 9 wherein the bias circuit comprises a thirteenth device having a gate, a drain coupled to its gate and the gates of the tenth and eleventh devices, and a source coupled to the first power supply terminal.

11. The high output voltage swing operational amplifier of claim 9 wherein the first, second, fourth, fifth, eighth, ninth, and twelfth devices are N-channel metal oxide semiconductor devices, and the third, sixth, seventh, tenth, and eleventh devices are P-channel metal oxide semiconductor devices.

12. The high output voltage swing operational amplifier of claim 1 further comprising:
   a resistor having a first terminal coupled to the gate of the first device and a second terminal;
   a first capacitor having a first terminal coupled to the second terminal of the resistor and a second terminal; and
   a second capacitor having a first terminal coupled to the second terminal of the first capacitor and a second terminal coupled to the output terminal.

13. The high output voltage swing operational amplifier of claim 1 wherein said second power supply voltage is greater than a breakdown voltage of the first through fifth devices.

14. The high output voltage swing operational amplifier of claim 13 further comprising a current mirror coupled between the first and second legs of devices such that a current in the second leg of devices is mirrored to the first leg of devices.

15. The high output voltage swing operational amplifier of claim 13 further comprising:
   a sixth device having a gate, and a drain and source coupled between the source of the third device and the second power supply terminal; and
   a seventh device having a gate coupled to the gate of the sixth device and the drain of the fifth device, and a drain and source coupled between the drain of the fifth device and the second power supply terminal.

16. The high output voltage swing operational amplifier of claim 15 further comprising:
   an eighth device having a gate, and a drain and source coupled between the source of the sixth device and the second power supply terminal; and
   a ninth device having a gate coupled to the gate of the eighth device and the source of the seventh device, and a drain and source coupled between the source of the seventh device and the second power supply terminal.

17. The high output voltage swing operational amplifier of claim 16 wherein the first, second, fourth, and fifth devices are of a first conductivity type and the third and sixth through ninth devices are of a second conductivity type.

18. The high output voltage swing operational amplifier of claim 16 wherein the first, second, fourth, and fifth devices are N-channel metal oxide semiconductor devices and the third and sixth through ninth devices are P-channel metal oxide semiconductor devices.

19. The high output voltage swing operational amplifier of claim 1 wherein the second voltage is greater than the first and second intermediate voltages.

20. The high output voltage swing operational amplifier of claim 15 further comprising an eighth device having a gate coupled to the second terminal, and a drain and source coupled between the source of the third device and the drain of the sixth device.

21. A high output voltage swing CMOS operational amplifier, comprising:
   first and second power supply terminals having first and second voltages thereon, respectively, wherein the second voltage is greater than the first voltage;
   an input circuit coupled between the first power supply terminal and a common terminal, and including first and second input terminals;
   a bias circuit coupled between the first power supply terminal and the common terminal, and to the input circuit for biasing the input circuit; and
   an output circuit coupled between the second power supply terminal and the common terminal, and to the input circuit, said output circuit including,
     a first device having a gate coupled to the input circuit, a drain, and a source coupled to the common terminal,
     a second device having a gate coupled to a first terminal having a first intermediate voltage thereon, a drain coupled to an output terminal, and a source coupled to the drain of the second device,
     a third device having a gate coupled to a second terminal having a second intermediate voltage thereon, a drain coupled to the output terminal, and a source,
     a fourth device having a gate, a drain coupled to the source of the third device, and a source coupled to the second power supply terminal;
     a fifth device having a gate coupled to the input circuit, a drain, and a source coupled to the common terminal,
     a sixth device having a gate coupled to the first terminal, a drain, and a source coupled to the drain of the fifth device, and
     a seventh device having a gate coupled to the gate of the fourth device, a drain coupled to its gate, and a source coupled to the second power supply terminal;
   wherein the second voltage is greater than a breakdown voltage of the first through seventh devices.

22. The high output voltage swing CMOS operational amplifier of claim 21 wherein the output circuit further comprises:
   an eight device having a gate, and a drain and source coupled between the source of the fourth device and the second power supply terminal; and
   a ninth device having a gate coupled to the gate of the eighth device and to its drain, and the drain and a source coupled between the source of the seventh device and the second power supply terminal.

23. The high output voltage swing CMOS operational amplifier of claim 22 further comprising a tenth device having a gate coupled to the second terminal, a drain coupled to the source of the third device, and a source coupled to the drain of the fourth device.

24. The high output voltage swing CMOS operational amplifier of claim 22 wherein the first, second, fifth and sixth devices are N-channel metal oxide semiconductor devices, and the third, fourth, seven, eighth, and ninth devices are P-channel metal oxide semiconductor devices.

25. The high output voltage swing CMOS operational amplifier of claim 21 wherein the output circuit further comprises:
   a resistor having a first terminal coupled to the gate of the first device and a second terminal;
   a first capacitor having a first terminal coupled to the second terminal of the resistor and a second terminal; and
   a second capacitor having a first terminal coupled to the second terminal of the first capacitor and a second terminal coupled to the output terminal.

26. The high output voltage swing CMOS operational amplifier of claim 22 wherein each of the first through ninth devices is a low voltage MOS device.

27. The high output voltage swing CMOS operational amplifier of claim 22 wherein the second voltage is greater than the first and second intermediate voltages.

28. A high output voltage swing operational amplifier, comprising:
- first and second power supply terminals having first and second voltages thereon, respectively, wherein the second voltage is greater than the first voltage;
- an input circuit coupled between the first power supply terminal and a common terminal, and including first and second input terminals;
- an output circuit coupled between the second power supply terminal and the common terminal, and to the input circuit, said output circuit includes first and second legs of devices, said first leg of devices including,
  - a first device having a gate coupled to the input circuit, a drain, and a source coupled to the common terminal,
  - a second device having a gate coupled to a first terminal having a first intermediate voltage thereon, a drain coupled to an output terminal, and a source coupled to the drain of the second device,
  - a third device having a gate coupled to a second terminal having a second intermediate voltage thereon, a drain coupled to the output terminal, and a source,
  - a fourth device having a gate, a drain coupled to the source of the third device, and a source, and
  - a fifth device having a gate, a drain coupled to the source of the fourth device, and a source coupled to the second power supply terminal,
- said second leg of devices including,
  - a sixth device having a gate, a drain, and a source coupled to the common terminal,
  - a seventh device having a gate coupled to the first terminal, a drain, and a source coupled to the drain of the sixth device,
  - an eighth device having a gate coupled to the gate of the fourth device, a drain coupled to its gate, and a source, and
  - a ninth device having a gate coupled to the gate of the fifth device, a drain coupled to its gate and the source of the eighth device, and a source coupled to the second power supply terminal,
  - wherein the second voltage is greater than a breakdown voltage of the first through ninth devices; and
- a bias circuit coupled between the first power supply terminal and the common terminal, to the input circuit for biasing the input circuit, and to the gate of the sixth device for providing a fixed bias current to the second leg of devices.

29. The high output voltage swing operational amplifier of claim 28 further comprising a tenth device having a gate coupled to the second terminal, a drain coupled to the source of the third device, and a source coupled to the drain of the fourth device.

30. The high output voltage swing operational amplifier of claim 29 wherein the first, second, fifth and sixth devices are N-channel metal oxide semiconductor devices, and the third, fourth, seven, eighth, ninth, and tenth devices are P-channel metal oxide semiconductor devices.

31. The high output voltage swing operational amplifier of claim 28 wherein the output circuit further comprises:
- a resistor having a first terminal coupled to the gate of the first device and a second terminal;
- a first capacitor having a first terminal coupled to the second terminal of the resistor and a second terminal; and
- a second capacitor having a first terminal coupled to the second terminal of the first capacitor and a second terminal coupled to the output terminal.

32. The high output voltage swing operational amplifier of claim 28 wherein the first through tenth devices are low voltage MOS devices.

* * * * *